(12) United States Patent
Kim et al.

(10) Patent No.: US 11,114,385 B2
(45) Date of Patent: Sep. 7, 2021

(54) PLATE-SHAPED WORKPIECE PROCESSING METHOD

(71) Applicant: DISCO CORPORATION, Tokyo (JP)

(72) Inventors: Youngsuk Kim, Tokyo (JP); Byeongdeck Jang, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/365,045

(22) Filed: Mar. 26, 2019

(65) Prior Publication Data

US 2019/0304927 A1    Oct. 3, 2019

(30) Foreign Application Priority Data

Mar. 28, 2018 (JP) .............................. JP2018-061786

(51) Int. Cl.
| | |
|---|---|
| *H01L 23/552* | (2006.01) |
| *H01L 23/31* | (2006.01) |
| *H01L 23/498* | (2006.01) |
| *H01L 23/00* | (2006.01) |
| *H01L 21/683* | (2006.01) |

(52) U.S. Cl.
CPC .......... *H01L 23/552* (2013.01); *H01L 21/683* (2013.01); *H01L 23/3114* (2013.01); *H01L 23/3128* (2013.01); *H01L 23/49805* (2013.01); *H01L 23/49816* (2013.01); *H01L 24/32* (2013.01); *H01L 24/48* (2013.01); *H01L 24/73* (2013.01); *H01L 24/97* (2013.01); *H01L 2221/68327* (2013.01); *H01L 2223/54486* (2013.01); *H01L 2224/32225* (2013.01); *H01L 2224/48227* (2013.01); *H01L 2224/73265* (2013.01)

(58) Field of Classification Search
CPC .......................................... H01L 21/683–68792
See application file for complete search history.

(56) References Cited

U.S. PATENT DOCUMENTS

2012/0300412 A1* 11/2012 Song ....................... H01L 24/97
361/728

FOREIGN PATENT DOCUMENTS

JP          2012039104 A    2/2012

* cited by examiner

*Primary Examiner* — Suberr L Chi
(74) *Attorney, Agent, or Firm* — Greer Burns & Crain, Ltd.

(57) ABSTRACT

A processing method for dividing a plate-shaped workpiece into a plurality of individual packages along a plurality of crossing division lines, in which the workpiece has terminals on the back side, includes the steps of attaching a protective member to the back side of the workpiece so as to cover the terminals to thereby unite the protective member with the workpiece, dividing the workpiece with the protective member along each division line to obtain the individual packages in a condition where the protective member is attached to each package, forming a conductive shield layer on the outer surface of each package, and peeling the protective member from each package.

5 Claims, 13 Drawing Sheets

PLATE-SHAPED WORKPIECE PROCESSING METHOD

BACKGROUND OF THE INVENTION

Field of the Invention

The present invention relates to a plate-shaped workpiece processing method.

Description of the Related Art

Conventionally known as a plate-shaped workpiece processing method is a method of dividing a plate-shaped workpiece such as a package substrate along division lines by dicing (see Japanese Patent Laid-Open No. 2012-039104, for example). In the processing method described in Japanese Patent Laid-Open No. 2012-039104, a plurality of terminals such as bumps are provided on the back side of a wiring substrate, and a plurality of semiconductor chips are mounted on the front side of the wiring substrate and collectively sealed with a sealing layer (resin layer) formed from a sealing compound. Thus, the package substrate is composed of the wiring substrate, the terminals provided on the back side of the wiring substrate, the semiconductor chips mounted on the front side of the wiring substrate, and the sealing layer formed on the front side of the wiring substrate so as to seal the semiconductor chips. This package substrate is divided along each division line by dicing to obtain a plurality of individual packages. Each package thus obtained is mounted through the terminals on a main substrate or the like.

SUMMARY OF THE INVENTION

In a case where the plate-shaped workpiece is cut from the front side where the sealing layer is formed, it is necessary to hold the back side of the workpiece where the terminals are provided, by using a holding jig or a holding tape. However, in the case of using the holding jig, the terminals are held under suction on the holding jig, causing a possibility that the terminals may be damaged by the holding jig. Similarly, in the case of using the holding tape, the terminals are held on the holding tape through an adhesive. However, it is difficult to make the holding tape have both the original characteristics of an adhesive tape and the characteristics of protecting the terminals. As a result, there is a possibility that the terminals may be damaged by the holding tape. Further, the front side of the workpiece may be held by such a jig or tape. In this case, however, the terminals exposed may be damaged by cutting dust, or the cutting dust may adhere to the terminals.

It is therefore an object of the present invention to provide a plate-shaped workpiece processing method which can properly process a plate-shaped workpiece without causing terminal defects.

In accordance with an aspect of the present invention, there is provided a plate-shaped workpiece processing method for dividing a plate-shaped workpiece into a plurality of individual packages along a plurality of crossing division lines, the workpiece including a wiring member having a first surface and a second surface opposite to the first surface, the first surface of the wiring member being partitioned into a plurality of regions by the plurality of crossing division lines, a plurality of terminals formed on each region of the first surface of the wiring member, a plurality of semiconductor chips mounted on the second surface of the wiring member by bonding, and a sealing layer formed on the second surface of the wiring member so as to seal the semiconductor chips, the sealing layer being formed from a sealing compound. The plate-shaped workpiece processing method includes a protective member attaching step of attaching a protective member to the first surface of the wiring member, the protective member having an adhesive layer for protecting the plurality of terminals, a dividing step of dividing the workpiece and the protective member along each division line after performing the protective member attaching step, thereby obtaining the individual packages in a condition where the protective member is attached to each package, a shield layer forming step of forming a conductive shield layer on an outer surface of each package after performing the dividing step, and a protective member peeling step of peeling the protective member from each package after performing the shield layer forming step.

With this configuration, the workpiece and the protective member are united with each other in the condition where the terminals of the workpiece are covered with the adhesive layer of the protective member. Accordingly, even when the workpiece is held by a holding jig or a holding tape in the condition where the holding jig or the holding tape is in contact with the sealing layer or the protective member, damage to the terminals can be prevented by the protective member. That is, the terminals can be properly protected by the protective member.

Preferably, according to the aspect of the present invention, the plate-shaped workpiece processing method further includes a workpiece holding step of holding the workpiece through the protective member on a holding jig or a holding tape after performing the protective member attaching step, in which the protective member is held under suction on the holding jig or attached to the holding tape as an adhesive tape.

More preferably, according to the aspect of the present invention, the plate-shaped workpiece processing method further includes a V groove forming step of cutting the workpiece along each division line to the depth from the upper surface of the sealing layer to the middle of the thickness of the workpiece by using a V groove forming unit after performing the workpiece holding step, thereby forming a V groove in the workpiece along each division line, the V groove having a side wall inclined from the upper surface of the sealing layer to the bottom of the V groove.

According to the present invention, the workpiece and the protective member are united with each other in the condition where the terminals of the workpiece are covered with the adhesive layer of the protective member. Accordingly, the workpiece can be properly processed without causing terminal defects.

The above and other objects, features, and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
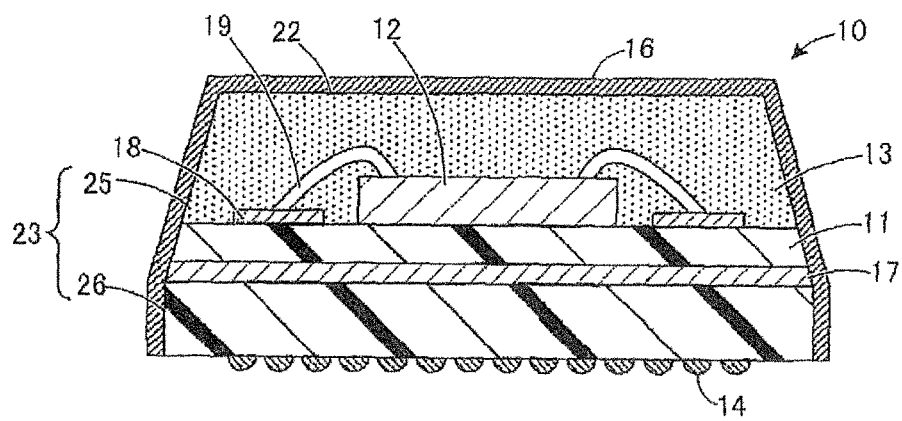
FIG. 1 is a schematic sectional view of a semiconductor package obtained by a processing method according to a preferred embodiment of the present invention.
Figure 2A:
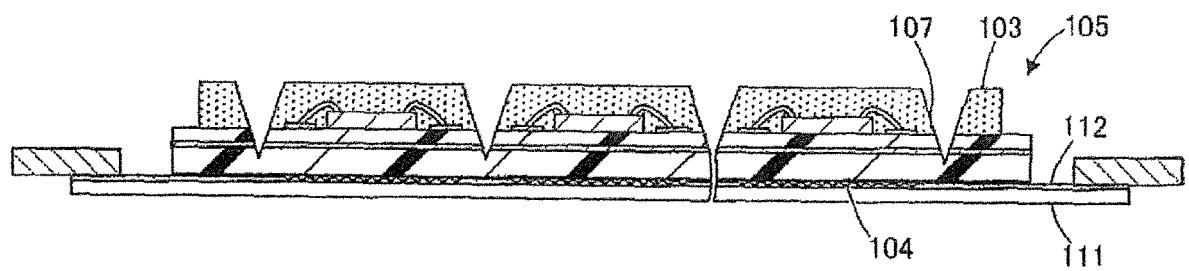
FIGS. 2A and 2B are sectional views for illustrating different conventional package substrate processing methods as comparisons.
Figure 2B:
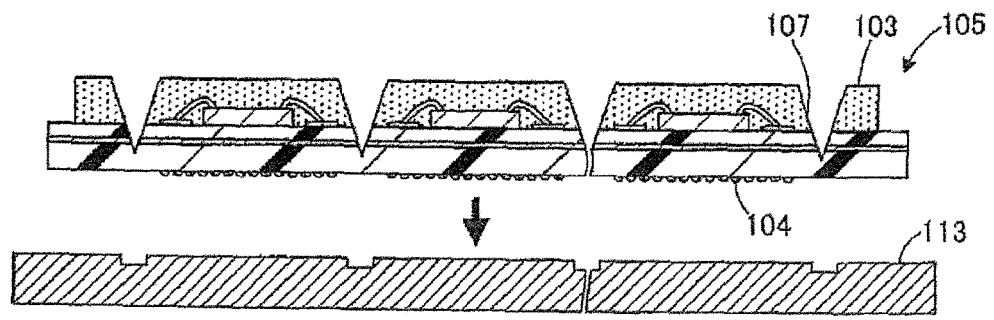

A package substrate processing method according to preferred embodiments of the present invention will now be described with reference to the attached drawings. FIG. 1 is a schematic sectional view of a semiconductor package obtained by the package substrate processing method according to this preferred embodiment. FIGS. 2A and 2B are sectional views for illustrating different conventional processing methods for a package substrate as comparisons. The following preferred embodiment is merely illustrative. For example, a certain step may be interposed between the adjacent steps of the processing method, or the order of the steps of the processing method may be suitably changed.

Referring to FIG. 1, there is depicted a semiconductor package 10 having a shield layer 16 forming an outer surface. The semiconductor package 10 is a packaged semiconductor device required to prevent so-called electro-magnetic interference (EMI). That is, the shield layer 16 functions to suppress leakage of electromagnetic noise from the semiconductor package 10 to the outside thereof. A semiconductor chip 12 is mounted on an upper surface (front side) of a wiring substrate (wiring member) 11. The semiconductor chip 12 is sealed with a resin layer (sealing layer, sealing compound) 13. The resin layer 13 is surrounded by the shield layer 16. Further, bumps 14 are provided on a lower surface (back side) of the wiring substrate 11. The wiring substrate 11 is formed with various wiring including terminals 18 and a ground line 17. The terminals 18 are connected through wires 19 to the semiconductor chip 12.

The semiconductor chip 12 is formed by dividing a semiconductor wafer having a plurality of devices into a plurality of semiconductor chips corresponding to the respective devices. The semiconductor chip 12 is mounted on the wiring substrate 11 at a predetermined position in such a manner as to be bonded through the wires 19 to the terminals 18 formed on the wiring substrate 11. The semiconductor package 10 has an upper surface 22 and a side surface 23 extending downward from the upper surface 22, in which the side surface 23 has an inclined surface 25 inclined so as to be reverse-tapered toward the bottom of the semiconductor package 10. The shield layer 16 is formed as a conductive film by sputtering or the like from the upper side of the semiconductor package 10 to this inclined surface 25 unlike a general semiconductor package having a vertical side surface. The inclined surface 25 of the side surface 23 of the semiconductor package 10 is inclined so as to obliquely intersect a direction (vertical direction) of film deposition for the shield layer 16, so that the shield layer 16 can be easily formed on the inclined surface 25.

Referring to FIG. 2A, there is depicted a conventional package substrate processing method as a first comparison, in which a V groove 107 is formed on a resin layer 103 of a package substrate 105, so as to form an inclined surface of a semiconductor package. Bumps 104 are formed on a lower surface of the package substrate 105. The V groove 107 is usually formed in a condition where the lower surface of the package substrate 105 is attached to an adhesive layer 112 of a holding tape 111. It is difficult to ensure both the original characteristics of the holding tape 111 and the protection characteristics for the bumps 104, such as a capability of embedding the bumps 104 in the adhesive layer 112 and a capability of preventing the adhesive layer 112 from being left on the bumps 104 after peeling the holding tape 111. Accordingly, there is a possibility that the bumps 104 may be damaged by the holding tape 111.

FIG. 2B depicts a second comparison, in which the package substrate 105 is divided into individual semiconductor packages on a holding jig 113. In this case, the bumps 104 of the package substrate 105 come into direct contact with the holding jig 113, causing a possibility that the bumps 104 may be broken or contaminated. Thus, both in the case that the package substrate 105 is held by the holding tape 111 and in the case that the package substrate 105 is held by the holding jig 113, there arises a problem that any trouble occurs in the bumps 104 to cause terminal defects. Further, the resin layer 103 of the package substrate 105 may be held by the holding tape 111 or the holding jig 113. In this case, however, there is a case that the bumps 104 may be damaged by cutting dust or the cutting dust may adhere to the bumps 104. Such a problem arises not only in the package substrate 105 having the bumps 104 as projection terminals, but also in a package substrate having lands as plane terminals. That is, also in the package substrate having lands, the lands may be damaged to cause terminal defects.

To cope with this problem, this preferred embodiment uses a protective member 31 (see FIG. 3C) that can be peeled without damage to the terminals. Then, various processing is performed in a condition where bumps 14 of a package substrate 15 (see FIG. 3C) are covered with the protective member 31. Accordingly, when a back side of the package substrate 15 is held through the protective member 31 by a holding tape 42 (see FIG. 3D) or a holding jig 61 (see FIG. 6A), any damage or contamination to the bumps 14 can be prevented by the protective member 31. Further, also when the resin layer 13 (front side) of the package substrate 15 is held by the holding tape 42 or the holding jig 61, any damage or contamination to the bumps 14 can be prevented by the protective member 31. Accordingly, after the package substrate 15 is divided into individual semiconductor packages 10 and the protective member 31 is next peeled from each semiconductor package 10, possible terminal defects of the bumps 14 of each semiconductor package 10 can be prevented.

Figure 3A:
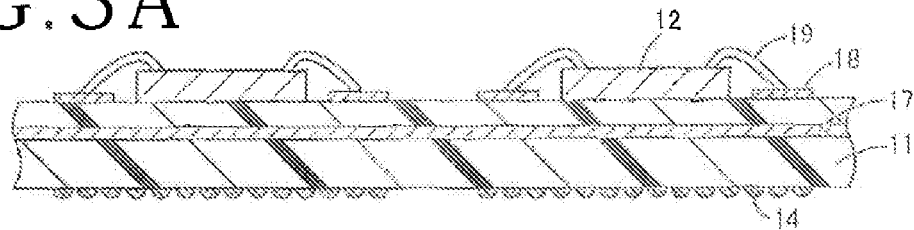
FIG. 3A is a sectional view depicting a mounting step in a processing method according to a first preferred embodiment.
Figure 3B:
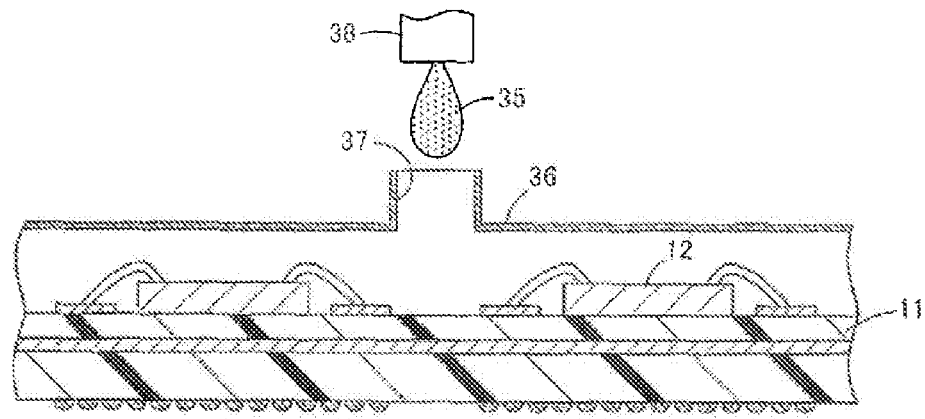
FIG. 3B is a sectional view depicting a substrate forming step according to the first preferred embodiment.
Figure 3C:
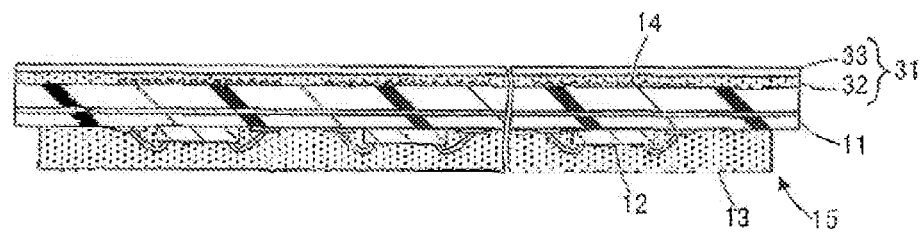
FIG. 3C is a sectional view depicting a protective member attaching step according to the first preferred embodiment.
Figure 3D:
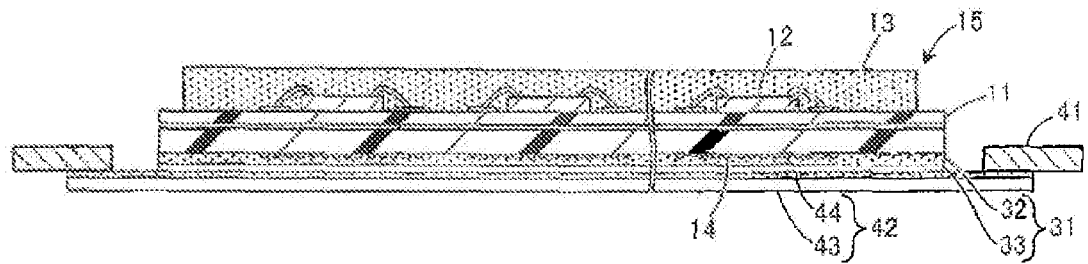
FIG. 3D is a sectional view depicting a substrate holding step according to the first preferred embodiment.
Figure 4A:
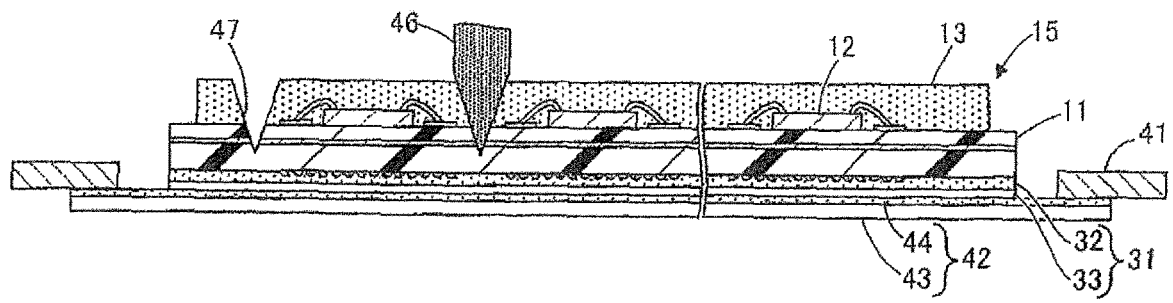
FIG. 4A is a sectional view depicting a V groove forming step according to the first preferred embodiment.
Figure 4B:
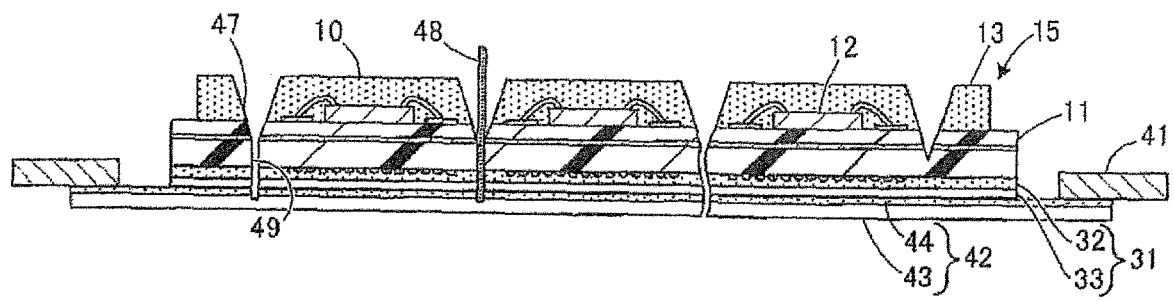
FIG. 4B is a sectional view depicting a dividing step according to the first preferred embodiment.
Figure 4C:
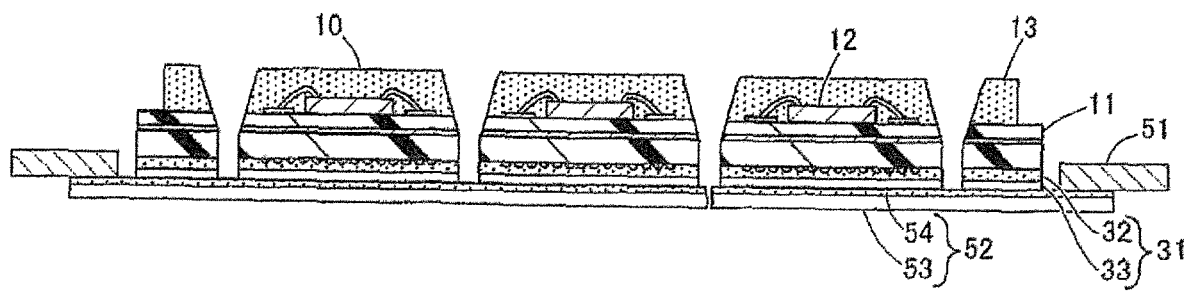
FIG. 4C is a sectional view depicting a transfer step according to the first preferred embodiment.
Figure 5A:
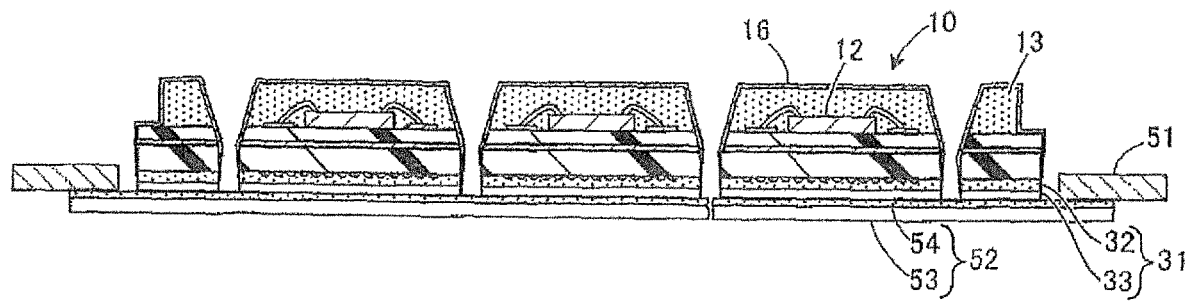
FIGS. 5A and 5B are sectional views depicting a shield layer forming step according to the first preferred embodiment.
Figure 5B:
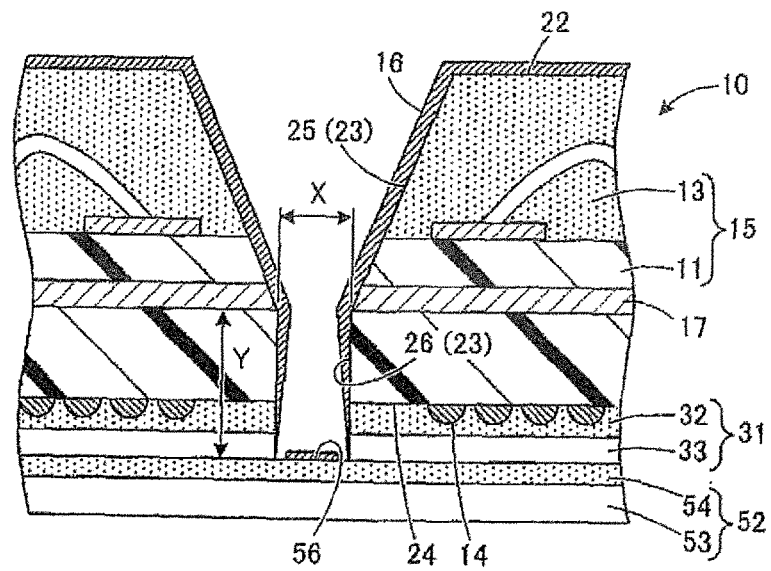
Figure 5C:
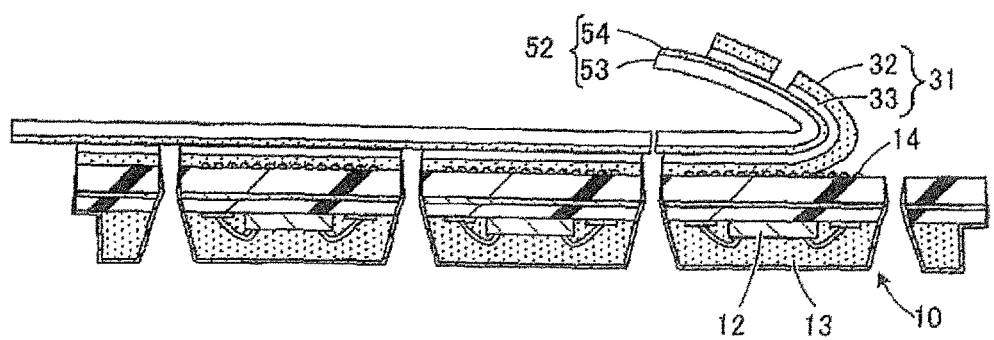
FIG. 5C is a sectional view depicting a protective member peeling step according to the first preferred embodiment.

A processing method for a plate-shaped workpiece such as a package substrate according to the present invention will now be described. A first preferred embodiment of the processing method according to the present invention will now be described with reference to FIGS. 3A to 5C. In the first preferred embodiment, frame dicing is adopted. FIG. 3A depicts a mounting step, FIG. 3B depicts a substrate forming step, FIG. 3C depicts a protective member attaching step, and FIG. 3D depicts a substrate holding step (workpiece holding step). FIG. 4A depicts a V groove forming step, FIG. 4B depicts a dividing step, and FIG. 4C depicts a transfer step. FIGS. 5A and 5B depict a shield layer forming step, and FIG. 5C depicts a protective member peeling step.

As depicted in FIG. 3A, the mounting step is first performed. In the mounting step, a plurality of semiconductor chips 12 are mounted on the front side (second surface) of a wiring substrate 11 so as to be individually located in a plurality of separate regions (device regions) defined by a plurality of crossing division lines set on the front side of the wiring substrate 11. More specifically, wiring including a ground line 17 is formed in the wiring substrate 11, and a plurality of bumps 14 are provided on the back side (first surface) of the wiring substrate 11. Further, each semiconductor chip 12 is connected through wires 19 to the wiring substrate 11. Terminals (not depicted) are formed on the front side of each semiconductor chip 12, and terminals 18 are formed on the front side of the wiring substrate 11, in which one end of each wire 19 is connected to each terminal of the semiconductor chip 12, and the other end of each wire 19 is connected to each terminal 18 of the wiring substrate 11. While such wire bonding is performed in the mounting step in this preferred embodiment, flip chip bonding may be performed instead. In the flip chip bonding, the terminals formed on the back side of each semiconductor chip 12 are directly connected to terminals formed on the front side of the wiring substrate 11.

As depicted in FIG. 3B, the substrate forming step is performed after performing the mounting step. In the substrate forming step, a sealing compound 35 is supplied to the front side of the wiring substrate 11 on which the plural semiconductor chips 12 have been mounted, thereby collectively sealing the semiconductor chips 12 with the sealing compound 35 to form a package substrate 15 (see FIG. 3C). More specifically, the back side of the wiring substrate 11 on which the plural semiconductor chips 12 have been mounted is held by a holding jig (not depicted), and a mold 36 is disposed so as to cover the front side (upper surface) of the wiring substrate 11. The mold 36 has an upper wall formed with an inlet opening 37, and a nozzle 38 for supplying the sealing compound 35 is positioned directly above the inlet opening 37.

In operation, the sealing compound 35 is supplied from the nozzle 38 through the inlet opening 37 to the front side of the wiring substrate 11 until the inside space (mold cavity) of the mold 36 is filled with the sealing compound 35, thereby sealing the semiconductor chips 12 with the sealing compound 35. Thereafter, the sealing compound 35 is heated or dried to be cured, thereby forming a resin layer 13 (see FIG. 3C) on the front side of the wiring substrate 11. Thus, the package substrate 15 (plate-shaped workpiece) is composed of the wiring substrate 11, the plural semiconductor chips 12 mounted on the front side of the wiring substrate 11, the resin layer 13 formed on the front side of the wiring substrate 11 so as to seal the plural semiconductor chips 12, and the bumps 14 provided on the back side of the wiring substrate 11. The sealing compound 35 is a curable liquid resin. Examples of the curable resin include epoxy resin, silicone resin, urethane resin, unsaturated polyester resin, acrylic urethane resin, and polyimide resin. While the sealing compound 35 is a liquid resin in this preferred embodiment, a sheet resin or a powder resin may be used instead. In this manner, the plural semiconductor chips 12 mounted on the wiring substrate 11 can be sealed collectively. In the case that the package substrate 15 is previously formed, the mounting step and the substrate forming step may be omitted.

As depicted in FIG. 3C, the protective member attaching step is performed after performing the substrate forming step. In the protective member attaching step, a protective member 31 for protecting the bumps 14 is attached to the back side of the package substrate 15 in a condition where the resin layer 13 of the package substrate 15 is held. The protective member 31 is composed of a base sheet 33 and an adhesive layer 32 formed on the base sheet 33. The adhesive layer 32 has a thickness and softness such that the bumps 14 can be embedded in the adhesive layer 32. Accordingly, when the bumps 14 are embedded in the adhesive layer 32, the protective member 31 is united with the package substrate 15 to thereby well protect the back side of the package substrate 15. That is, the bumps 14 provided on the back side of the package substrate 15 are protected by the protective member 31 so as to prevent the bumps 14 from coming into contact with any other members.

The base sheet 33 of the protective member 31 is preferably formed of a material having heat resistance up to 150° C. to 170° C. Examples of this material include polyethylene naphthalate resin and polyimide resin.

The adhesive layer 32 may be formed by curing a liquid resin that can be cured by ultraviolet light and also can be swelled by hot water. That is, this liquid resin can be cured by applying ultraviolet light and also can be swelled by supplying hot water having a temperature of approximately 90° C. In this case, even when a cleaning water having a temperature of approximately 20° C. is sprayed to the protective member 31 in the V groove forming step and the dividing step to be performed later, there is no possibility that the protective member 31 may be peeled from the package substrate 15 during processing. Further, in the protective member peeling step to be performed later, hot water may be supplied to the adhesive layer 32 to thereby swell the adhesive layer 32, so that the protective member 31 can be well peeled from each semiconductor package 10 with no adhesive left on the bumps 14.

As depicted in FIG. 3D, the substrate holding step is performed after performing the protective member attaching step. In the substrate holding step, a holding tape 42 is attached to the protective member 31 attached to the back side of the package substrate 15. The holding tape 42 is previously supported in its peripheral portion to a ring frame 41 having a central opening. Accordingly, a central portion of the holding tape 42 is attached to the protective member 31 of the package substrate 15 in such a manner that the central opening of the ring frame 41 is closed by the holding tape 42 and the package substrate 15 is located in the central opening of the ring frame 41. Thus, the package substrate 15 is supported through the holding tape 42 to the ring frame 41 in a condition where the protective member 31 is interposed between the back side of the package substrate 15 and the holding tape 42. That is, the bumps 14 provided on the back side of the package substrate 15 are attached through the protective member 31 to the holding tape 42, so that the holding tape 42 does not adhere to the bumps 14.

The holding tape 42 is a so-called dicing tape. That is, the holding tape 42 is composed of a base sheet 43 and an adhesive layer 44 formed on the base sheet 43. The adhesive layer 44 is formed of ultraviolet curable adhesive or heat curable adhesive having a property such that the adhesion is reduced by external stimulus such as ultraviolet light and heat. The ring frame 41 may be a ring frame having a circular outside shape as viewed in plan or a ring frame having a rectangular outside shape as viewed in plan.

As depicted in FIG. 4A, the V groove forming step is performed after performing the substrate holding step. The V groove forming step is performed by using a cutting blade 46 having a V-shaped tip (i.e., a cutting edge having a V-shaped cross section), which will be hereinafter referred to as a V blade 46, in which the V blade 46 is formed by fixing diamond abrasive grains or the like with a bond. In the V groove forming step, the wiring substrate 11 of the package substrate 15 is held through the holding tape 42 on a chuck table (not depicted), and the V blade 46 is aligned with each division line of the package substrate 15. Thereafter, the V blade 46 is lowered at a position horizontally outside the package substrate 15 to a depth corresponding to the middle of the thickness of the package substrate 15. Thereafter, the package substrate 15 is moved in a horizontal direction perpendicular to the sheet plane of FIG. 4A as rotating the V blade 46 about its rotation axis extending in a horizontal direction parallel to the sheet plane of FIG. 4A.

Accordingly, the package substrate 15 is half cut along each division line to the depth from the upper surface of the resin layer 13 to the middle of the thickness of the wiring substrate 11 by the V blade 46, thereby forming a V groove 47 along each division line as depicted in FIG. 4A. Accordingly, the V groove 47 has a pair of inclined side walls tapering toward the bottom of this groove.

Figure 17:
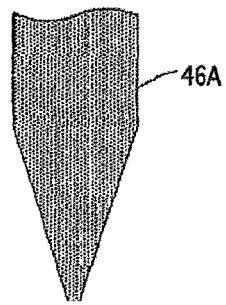
FIG. 17 is a sectional view depicting a V blade according to a modification of the first preferred embodiment.

While the V-shaped tip of the V blade 46 is pointed in this preferred embodiment, the V-shaped tip of the V blade 46 is not limited. That is, it is only necessary that the V-shaped tip of the V blade 46 can form the V groove 47 in the package substrate 15. For example, FIG. 17 depicts a V blade 46A as a modification of the V blade 46. As depicted in FIG. 17, the V blade 46A has a V-shaped tip with a flat end. That is, the V-shaped tip of the V blade 46A depicted in FIG. 17 is not pointed. Thus, the V-shaped tip of the V blade usable in the present invention is not limited to a completely V-shaped tip having a pointed end, but also includes a substantially V-shaped tip having a flat end. Further, the V-shaped tip of the V blade usable in the present invention may be slightly rounded rather than formed by flat inclined surfaces.

As depicted in FIG. 4B, the dividing step is performed after performing the V groove forming step. The dividing step is performed by using a cutting blade 48 having a uniform thickness smaller than the thickness of the V blade 46, which will be hereinafter referred to as a straight blade 48. The straight blade 48 has a cutting edge having a rectangular cross section. The straight blade 48 is formed by fixing diamond abrasive grains or the like with a bond. In the dividing step, the straight blade 48 is aligned with each V groove 47 of the package substrate 15 held on the chuck table. Thereafter, the straight blade 48 is lowered at a position horizontally outside the package substrate 15 to a depth corresponding to the middle of the thickness of the holding tape 42. Thereafter, the package substrate 15 is moved in a horizontal direction perpendicular to the sheet plane of FIG. 4B as rotating the straight blade 48 about its rotation axis extending in a horizontal direction parallel to the sheet plane of FIG. 4B.

Accordingly, the package substrate 15 is fully cut along each division line (each V groove 47) by the straight blade 48 to thereby form a rectangular groove (straight groove) 49 having a depth from the bottom of each V groove 47 to the middle of the thickness of the holding tape 42. Accordingly, the package substrate 15 and the protective member 31 are divided along each V groove 47, i.e., along each division line to thereby obtain a plurality of individual semiconductor packages 10. While the V groove forming step is performed for all the division lines and the dividing step is next performed for all the division lines in this preferred embodiment, the configuration is not limited. For example, a twin-blade dicing apparatus including both the V blade 46 and the straight blade 48 may be used to continuously perform the V groove forming step and the dividing step for each division line.

As depicted in FIG. 4C, the transfer step is performed after performing the dividing step. In the transfer step, external stimulus such as ultraviolet light and heat is applied to the adhesive layer 44 of the holding tape 42 (see FIG. 4B) to thereby reduce the adhesion of the adhesive layer 44 of the holding tape 42, then separating each semiconductor package 10 with the protective member 31 from the holding tape 42. Since the adhesion of the adhesive layer 44 of the holding tape 42 is mainly reduced by the external stimulus, the holding tape 42 is separated from the protective member 31, so that there is no possibility that the protective member 31 may be peeled from each semiconductor package 10. After separating each semiconductor package 10 with the protective member 31 from the holding tape 42, each semiconductor package 10 with the protective member 31 is attached again to another holding tape 52 for plasma processing. The holding tape 52 is previously supported in its peripheral portion to a ring frame 51. Each semiconductor package 10 is attached through the protective member 31 to a central portion of the holding tape 52 so as to be surrounded by the ring frame 51.

All of the semiconductor packages 10 are arranged at suitable intervals on the holding tape 52, so as to form a shield layer 16 both on the upper surface 22 of each semiconductor package 10 and on the side surface 23 of each semiconductor package 10 (see FIG. 5B) in the subsequent step. The holding tape 52 for plasma processing is composed of a base sheet 53 and an adhesive layer 54 formed on the base sheet 53. The adhesive layer 54 is also formed of ultraviolet curable adhesive or heat curable adhesive having a property such that the adhesion is reduced by external stimulus such as ultraviolet light and heat.

Further, the base sheet 53 of the holding tape 52 is preferably formed of a material having heat resistance up to 150° C. to 170° C. Examples of this material include polyethylene naphthalate resin and polyimide resin. The ring frame 51 may be a ring frame having a circular outside shape as viewed in plan or a ring frame having a rectangular outside shape as viewed in plan.

As depicted in FIG. 5A, the shield layer forming step is performed after performing the transfer step. In the shield layer forming step, a shield layer 16 is formed on the outer surface of each semiconductor package 10 by depositing a conductive material. More specifically, the individual semiconductor packages 10 divided from each other and held by the holding tape 52 are loaded into a plasma processing apparatus (not depicted), and a conductive material is next deposited to the upper surface 22 and the side surface 23 of each semiconductor package 10 (see FIG. 5B) under predetermined film deposition conditions by performing plasma processing such as sputtering from the upper side of each semiconductor package 10, thereby forming the shield layer 16 having a desired thickness on the upper surface 22 and the side surface 23 of each semiconductor package 10.

As depicted in FIG. 5B, an inclined surface 25 is formed as a part of the side surface 23 of each semiconductor package 10. The inclined surface 25 is inclined so as to be reverse-tapered from the upper surface 22 toward the bottom of each semiconductor package 10. That is, the inclined surface 25 is inclined so as to obliquely intersect a direction (vertical direction) of film deposition for the shield layer 16, so that the shield layer 16 can be easily formed in such a manner that a conductive film having a thickness capable of exhibiting a sufficient shield effect can be deposited not only on the upper surface 22, but also on the inclined surface 25 of the side surface 23.

As depicted in FIG. 5B, the side surface 23 of each semiconductor package 10 has a vertical surface 26 formed below the inclined surface 25, and a groove having a bottom 56 is formed between any adjacent ones of the semiconductor packages 10. The shield layer 16 is also formed on the vertical surface 26 of each semiconductor package 10 and the bottom 56 of each groove. Accordingly, in picking up each semiconductor package 10 from the holding tape 52, there is a possibility that burrs may be generated from the shield layer 16 at a lower portion of each semiconductor package 10. In this case, the generation of the burrs in each semiconductor package 10 can be suppressed by adjusting an aspect ratio (the ratio between the width and the depth of the groove between the adjacent semiconductor packages 10) in addition to the film deposition conditions for the shield layer 16. The aspect ratio of the groove between the adjacent semiconductor packages 10 may be adjusted according to the spacing between the adjacent semiconductor packages 10 in attaching each semiconductor package 10 to the holding tape 52 in the transfer step.

As depicted in FIG. 5B, the aspect ratio of the groove between the adjacent semiconductor packages 10 is represented by Y/X, where Y (mm) is the depth of the groove from the lower end of the inclined surface 25 (i.e., the upper end of the vertical surface 26) to the bottom 56 of the groove, and X (mm) is the width of the groove, i.e., the spacing between the opposed vertical surfaces 26 of the adjacent semiconductor packages 10. The lower portion of the vertical surface 26 of each side surface 23 and the bottom 56 of the groove between the adjacent semiconductor packages 10 are prone to be influenced by the aspect ratio. That is, when the aspect ratio of the groove between the adjacent semiconductor packages 10 is increased, the thickness of the shield layer 16 is reduced. Accordingly, by increasing the aspect ratio, the thickness of the shield layer 16 at the lower portion of the vertical surface 26 and at the bottom 56 of the groove formed between the adjacent semiconductor packages 10 can be reduced. That is, the thickness of the shield layer 16 formed on the inclined surface 25 of each side surface 23 becomes a suitable thickness for the shield effect because the influence of the aspect ratio is less, whereas the thickness of the shield layer 16 formed on the lower portion of the vertical surface 26 and the bottom 56 of the groove between the adjacent semiconductor packages 10 becomes a small thickness because the influence of the aspect ratio is more. Accordingly, the generation of burrs can be suppressed.

As described above, the shield layer 16 is also formed on the vertical surface 26 of the side surface 23 of each semiconductor package 10. Accordingly, if the bottom surface 24 (see FIG. 5B) of each semiconductor package 10 is exposed, there is a possibility that the shield layer 16 may be also formed on the bottom surface 24 due to scattering to cause trouble to the bumps 14. To the contrary, according to this preferred embodiment, the bottom surface 24 of each semiconductor package 10 is fully covered with the protective member 31, so that there is no possibility that the shield layer 16 may be formed on the bottom surface 24 of each semiconductor package 10 due to scattering. Thus, the protective member 31 functions not only to protect the bumps 14 from impact or the like, but also to prevent the deposition of a conductive material on the bumps 14 of each semiconductor package 10 due to scattering in forming the shield layer 16.

The ground line 17 in the wiring substrate 11 is exposed to the lower portion of the inclined surface 25 of each side surface 23. The shield layer 16 having a suitable thickness is formed on the lower portion of the inclined surface 25, so that the shield layer 16 is connected to the ground line 17. Accordingly, the electromagnetic noise generated in each semiconductor package 10 can be removed through the ground line 17 to the outside of each semiconductor package 10. Further, the shield layer 16 formed on the lower portion of the vertical surface 26 of each side surface 23 is thin. However, electromagnetic noise can be cut off by various wiring (not depicted) formed in the wiring substrate 11. Accordingly, the leakage of electromagnetic noise to any electronic components about each semiconductor package 10 can be generally prevented.

Further, it is only essential that the ground line 17 in the wiring substrate 11 is to be connected to the shield layer 16. Accordingly, the ground line 17 may be connected to the shield layer 16 formed on the vertical surface 26 of each side surface 23. The conductive material for forming the shield layer 16 is metal such as copper, titanium, nickel, and gold. At least one of such metals is selected to form a conductive film having a thickness of several micrometers or more as the shield layer 16. The shield layer 16 may be formed by any method such as sputtering, ion plating, chemical vapor deposition (CVD), physical vapor deposition (PVD), and plating. The protective member 31 and the holding tape 52 are preferably formed of materials having resistance to the processing in the shield layer forming step. That is, the materials of the protective member 31 and the holding tape 52 are preferably selected from materials having resistance such as vacuum resistance, heat resistance, and chemical resistance according to the types of the processing in the shield layer forming step.

As depicted in FIG. 5C, the protective member peeling step is performed after performing the shield layer forming step. In the protective member peeling step, the protective member 31 is peeled from the back side of each semiconductor package 10 where the bumps 14 are provided. More specifically, the resin layer 13 of each semiconductor package 10 is held on a holding jig (not depicted). In this condition, one end of the holding tape 52 is picked up and horizontally moved. As a result, the protective member 31 is peeled from each semiconductor package 10 in the condition where the protective member 31 is united with the holding tape 52. For example, in the case that the adhesive layer 32 of the protective member 31 is formed by curing an ultraviolet curable liquid resin that can be swelled by hot water, the protective member 31 can be easily peeled from each semiconductor package 10 by supplying hot water to the protective member 31. In this manner, each semiconductor package 10 having an outer surface covered with the shield layer 16 can be manufactured.

Figure 6A:
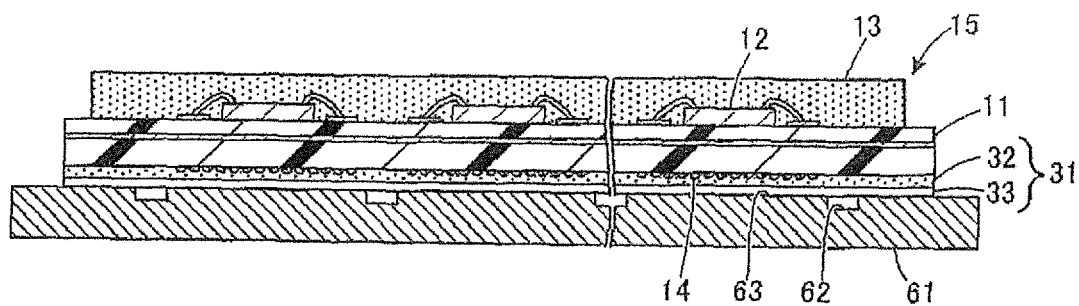
FIG. 6A is a sectional view depicting a substrate holding step in a processing method according to a second preferred embodiment.

A second preferred embodiment of the processing method according to the present invention will now be described with reference to FIGS. 6A to 6C. In the second preferred embodiment, jig dicing is adopted. The second preferred embodiment is different from the first preferred embodiment in only the point that a holding jig is used in the second preferred embodiment in place of a holding tape in the substrate holding step, the V groove forming step, and the dividing step. Accordingly, the description of the other similar steps will be omitted herein. FIG. 6A depicts a substrate holding step, FIG. 6B depicts a V groove forming step, and FIG. 6C depicts a dividing step.

As depicted in FIG. 6A, the substrate holding step is performed in such a manner that the wiring substrate 11 of the package substrate 15 is held through the protective member 31 on a holding jig 61. A plurality of crossing relief grooves 62 are formed on the upper surface of the holding jig 61 so as to respectively correspond to the plural crossing division lines of the package substrate 15, thereby defining a plurality of holding surfaces 63 for holding the package substrate 15. That is, each holding surface 63 corresponds to each region defined by the plural relief grooves 62.

Accordingly, the back side of the package substrate 15 is held through the protective member 31 on the holding surfaces 63 of the holding jig 61, so that there is no possibility that the bumps 14 provided on the back side of the package substrate 15 may be damaged by the holding surfaces 63.

Figure 6B:
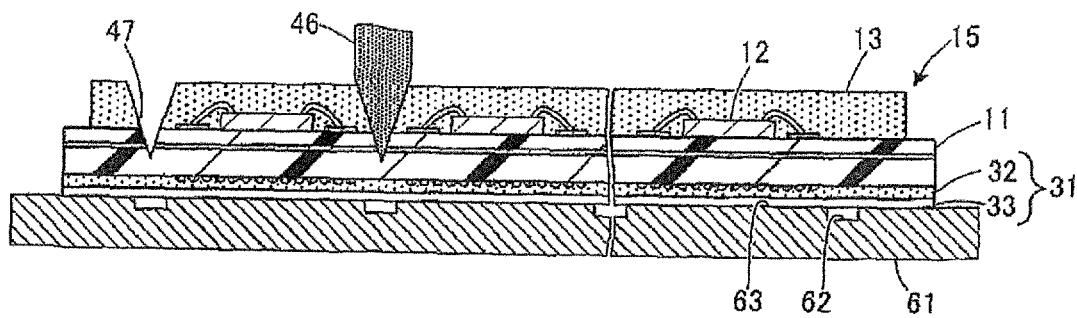
FIG. 6B is a sectional view depicting a V groove forming step according to the second preferred embodiment.
Figure 6C:
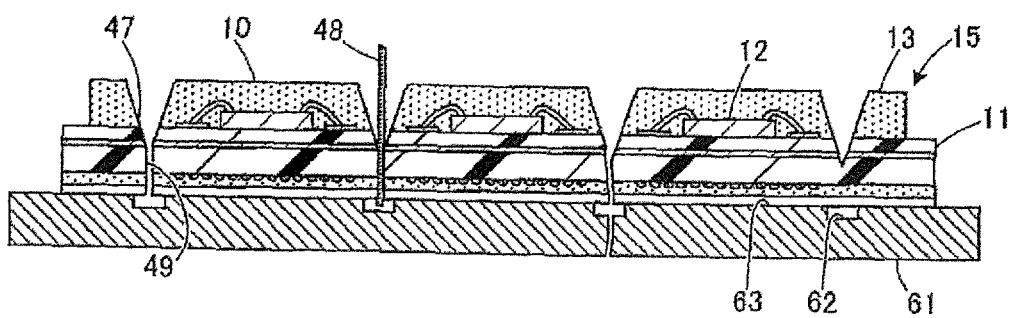
FIG. 6C is a sectional view depicting a dividing step according to the second preferred embodiment.

As depicted in FIG. 6B, the V groove forming step is performed after performing the substrate holding step. In the V groove forming step, a V blade 46 is aligned with each division line of the package substrate 15 in a condition where the package substrate 15 is held on the holding jig 61. Thereafter, the V blade 46 is lowered at a position horizontally outside the package substrate 15 to the depth corresponding to the middle of the thickness of the package substrate 15. Thereafter, the package substrate 15 is moved in a horizontal direction perpendicular to the sheet plane of FIG. 6B as rotating the V blade 46 about its rotation axis extending in a horizontal direction parallel to the sheet plane of FIG. 6B. Accordingly, the package substrate 15 is half cut along each division line to the depth from the upper surface of the resin layer 13 to the middle of the thickness of the wiring substrate 11 by the V blade 46, thereby forming a V groove 47 along each division line as depicted in FIG. 6B.

As depicted in FIG. 6C, the dividing step is performed after performing the V groove forming step. In the dividing step, a straight blade 48 is aligned with each V groove 47 of the package substrate 15 held on the holding jig 61. Thereafter, the straight blade 48 is lowered at a position horizontally outside the package substrate 15 to the depth corresponding to the inside of each relief groove 62 of the holding jig 61. Thereafter, the package substrate 15 is moved in a horizontal direction perpendicular to the sheet plane of FIG. 6C as rotating the straight blade 48 about its rotation axis extending in a horizontal direction parallel to the sheet plane of FIG. 6C. Accordingly, the package substrate 15 is fully cut along each division line (each V groove 47) by the straight blade 48 to thereby form a rectangular groove (straight groove) 49 having a depth from the bottom of each V groove 47 to the inside of each relief groove 62. Accordingly, the package substrate 15 and the protective member 31 are divided along each V groove 47, i.e., along each division line to thereby obtain a plurality of individual semiconductor packages 10. Also in the second preferred embodiment, a twin-blade dicing apparatus including both the V blade 46 and the straight blade 48 may be used to continuously perform the V groove forming step and the dividing step for each division line.

Figure 7A:
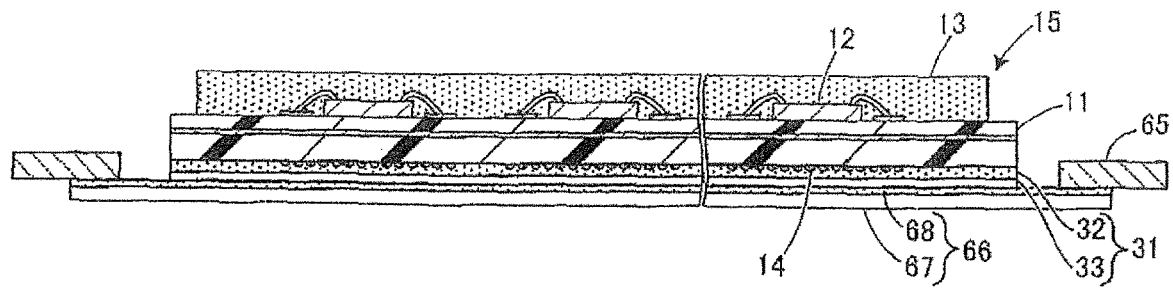
FIG. 7A is a sectional view depicting a substrate holding step in a processing method according to a third preferred embodiment.
Figure 7B:
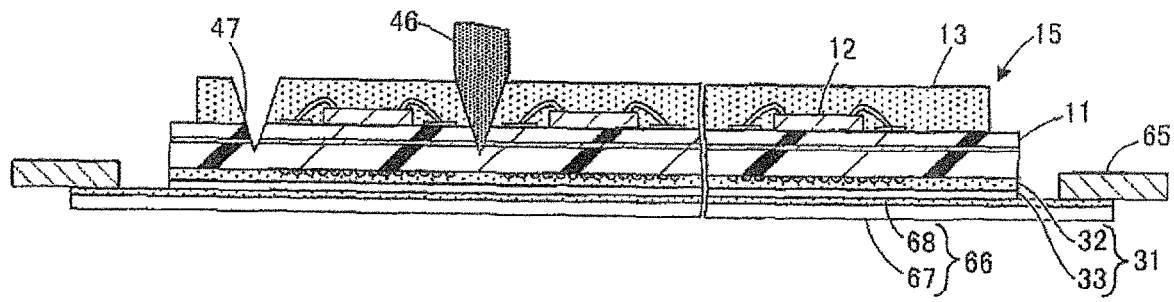
FIG. 7B is a sectional view depicting a V groove forming step according to the third preferred embodiment.
Figure 7C:
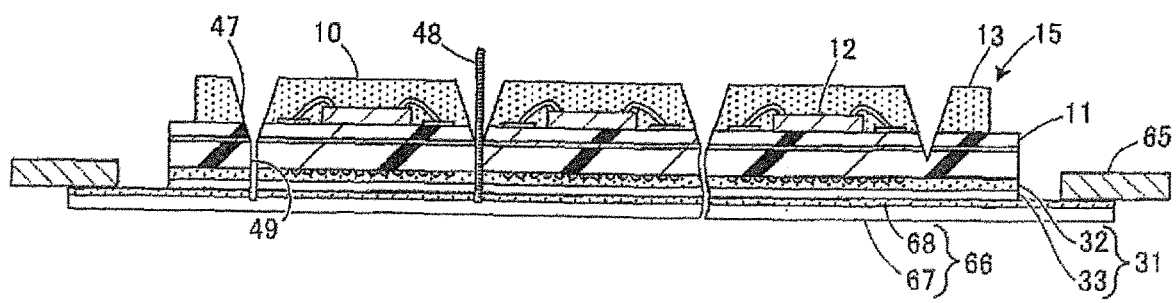
FIG. 7C is a sectional view depicting a dividing step according to the third preferred embodiment.
Figure 8A:
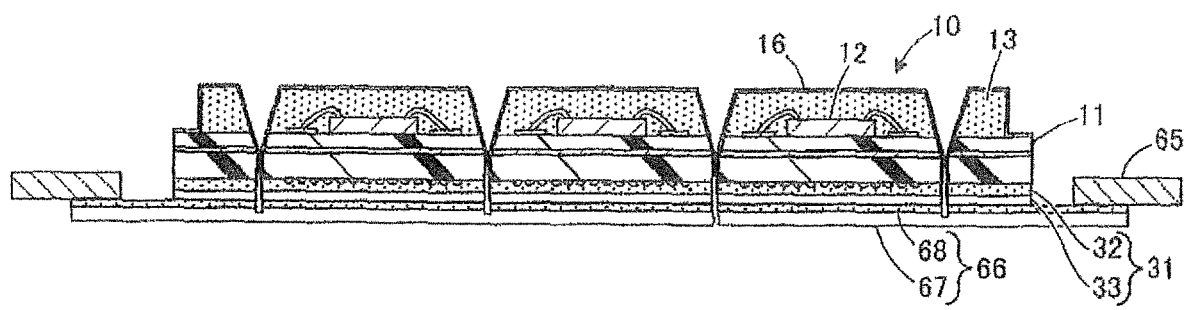
FIGS. 8A and 8B are sectional views depicting a shield layer forming step according to the third preferred embodiment.
Figure 8B:
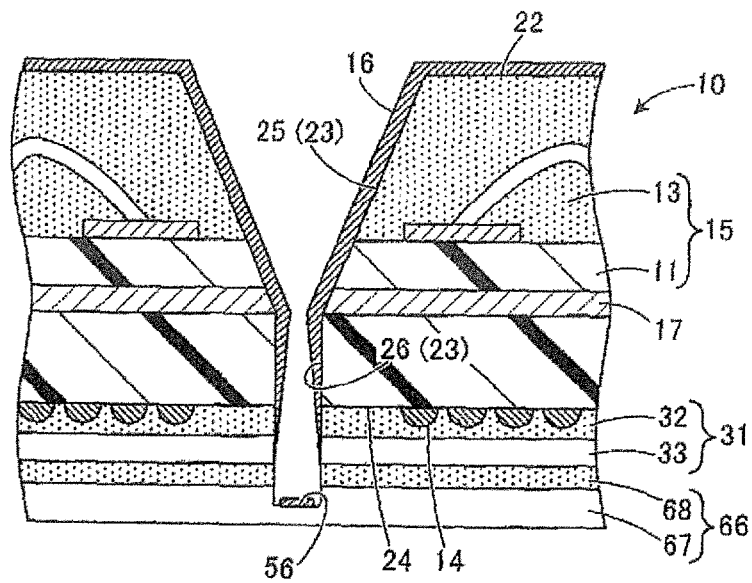
Figure 8C:
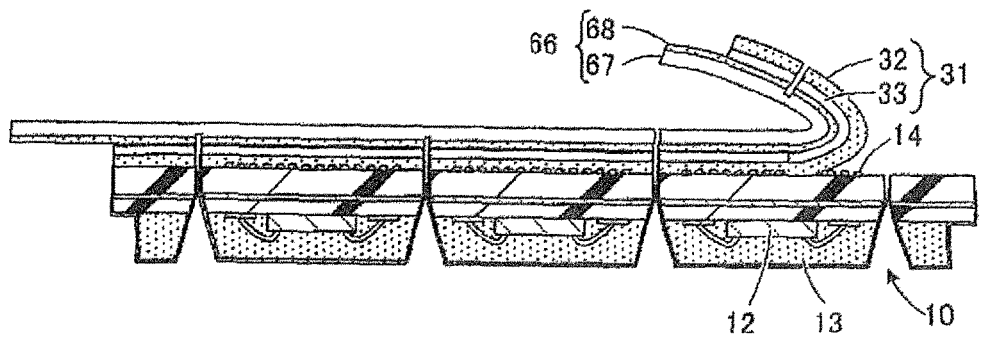
FIG. 8C is a sectional view depicting a protective member peeling step according to the third preferred embodiment.

A third preferred embodiment of the processing method according to the present invention will now be described with reference to FIGS. 7A to 8C. In the third preferred embodiment, an all-in-one holding tape is used. The third preferred embodiment is different from the first preferred embodiment in only the point that such an all-in-one holding tape is commonly used in performing both the dicing and the shield layer formation. Accordingly, the description of the steps similar to those in the first preferred embodiment will be omitted herein. That is, there will now be described a substrate holding step, V groove forming step, dividing step, shield layer forming step, and protective member peeling step. FIG. 7A depicts a substrate holding step, FIG. 7B depicts a V groove forming step, and FIG. 7C depicts a dividing step. FIGS. 8A and 8B depict a shield layer forming step, and FIG. 8C depicts a protective member peeling step.

As depicted in FIG. 7A, the substrate holding step is performed in such a manner that a holding tape 66 is attached to the protective member 31 attached to the back side of the package substrate 15. The holding tape 66 is previously supported in its peripheral portion to a ring frame 65 having a central opening. Accordingly, a central portion of the holding tape 66 is attached to the protective member 31 of the package substrate 15 in such a manner that the central opening of the ring frame 65 is closed by the holding tape 66 and the package substrate 15 is located in the central opening of the ring frame 65. Thus, the package substrate 15 is supported through the holding tape 66 to the ring frame 65 in a condition where the protective member 31 is interposed between the back side of the package substrate 15 and the holding tape 66. That is, the bumps 14 provided on the back side of the package substrate 15 are attached through the protective member 31 to the holding tape 66, so that the holding tape 66 does not adhere to the bumps 14.

The holding tape 66 is a holding tape commonly usable in performing both the dicing and the shield layer formation. The holding tape 66 is composed of a base sheet 67 and an adhesive layer 68 formed on the base sheet 67. The adhesive layer 68 is formed of ultraviolet curable adhesive or heat curable adhesive having a property such that the adhesion is reduced by external stimulus such as ultraviolet light and heat. The ring frame 65 may be a ring frame having a circular outside shape as viewed in plan or a ring frame having a rectangular outside shape as viewed in plan.

Further, the base sheet 67 of the holding tape 66 is preferably formed of a material having heat resistance up to 150° C. to 170° C. Examples of this material include polyethylene naphthalate resin and polyimide resin. In this manner, the holding tape 66 having resistance to the processing for forming a shield layer is used as a dicing tape in this preferred embodiment, so that the transfer step of changing the holding tape 42 to the holding tape 52 in the first preferred embodiment can be omitted in the third preferred embodiment.

As depicted in FIG. 7B, the V groove forming step is performed after performing the substrate holding step. In the V groove forming step, the wiring substrate 11 of the package substrate 15 is held through the holding tape 66 on a chuck table (not depicted), and a V blade 46 is aligned with each division line of the package substrate 15. Thereafter, the V blade 46 is lowered at a position horizontally outside the package substrate 15 to the depth corresponding to the middle of the thickness of the package substrate 15. Thereafter, the package substrate 15 is moved in a horizontal direction perpendicular to the sheet plane of FIG. 7B as rotating the V blade 46 about its rotation axis extending in a horizontal direction parallel to the sheet plane of FIG. 7B. Accordingly, the package substrate 15 is half cut along each division line to the depth from the upper surface of the resin layer 13 to the middle of the thickness of the wiring substrate 11 by the V blade 46, thereby forming a V groove 47 along each division line as depicted in FIG. 7B.

As depicted in FIG. 7C, the dividing step is performed after performing the V groove forming step. In the dividing step, a straight blade 48 is aligned with each V groove 47 of the package substrate 15 held on the chuck table. Thereafter, the straight blade 48 is lowered at a position horizontally outside the package substrate 15 to the depth corresponding to the middle of the thickness of the holding tape 66. Thereafter, the package substrate 15 is moved in a horizontal direction perpendicular to the sheet plane of FIG. 7C as rotating the straight blade 48 about its rotation axis extending in a horizontal direction parallel to the sheet plane of FIG. 7C. Accordingly, the package substrate 15 is fully cut along each division line (each V groove 47) by the straight blade 48 to thereby form a rectangular groove (straight groove) 49 having a depth from the bottom of each V groove 47 to the middle of the thickness of the holding tape 66. Accordingly, the package substrate 15 and the protective member 31 are divided along each V groove 47, i.e., along each division line to thereby obtain a plurality of individual semiconductor packages 10. Also in the third preferred embodiment, a twin-blade dicing apparatus including the V blade 46 and the straight blade 48 may be used to continuously perform the V groove forming step and the dividing step for each division line.

As depicted in FIG. 8A, the shield layer forming step is performed after performing the dividing step. In the shield layer forming step, a shield layer 16 is formed on the outer surface of each semiconductor package 10 by depositing a conductive material. More specifically, the individual semiconductor packages 10 divided from each other and held by the holding tape 66 are loaded into a plasma processing apparatus (not depicted), and a conductive material is next deposited to the upper surface 22 and the side surface 23 of each semiconductor package 10 (see FIG. 8B) under predetermined film deposition conditions by performing plasma processing such as sputtering from the upper side of each semiconductor package 10, thereby forming the shield layer 16 having a desired thickness on the upper surface 22 and the side surface 23 of each semiconductor package 10.

As depicted in FIG. 8B, an inclined surface 25 is formed as a part of the side surface 23 of each semiconductor package 10. The inclined surface 25 is inclined so as to be reverse-tapered from the upper surface 22 toward the bottom of each semiconductor package 10. That is, the inclined surface 25 is inclined so as to obliquely intersect the direction (vertical direction) of film deposition for the shield layer 16, so that the shield layer 16 can be easily formed in such a manner that a conductive film having a thickness capable of exhibiting a sufficient shield effect can be deposited not only on the upper surface 22, but also on the inclined surface 25 of the side surface 23. Furthermore, since both the holding tape 66 and the protective member 31 have resistance to the plasma processing, there is no possibility that the holding tape 66 and the protective member 31 may be deteriorated.

The generation of burrs due to the shield layer 16 in each semiconductor package 10 can be suppressed by adjusting the aspect ratio (the ratio between the width and the depth of the groove between the adjacent semiconductor packages 10) in addition to the film deposition conditions for the shield layer 16. The aspect ratio of the groove between the adjacent semiconductor packages 10 may be adjusted according to the thickness of the straight blade 48 (see FIG. 7C) and the depth of cut by the straight blade 48. Further, the bottom surface 24 of each semiconductor package 10 is fully covered with the protective member 31, so that there is no possibility that the shield layer 16 may be formed on the bottom surface 24 of each semiconductor package 10 due to scattering. That is, there is no possibility that a conductive material may be deposited on the bumps 14 of each semiconductor package 10 due to scattering in forming the shield layer 16. Further, the dicing and the plasma processing can be performed without changing the holding tape 66, so that the number of steps can be reduced to thereby effect cost reduction.

Further, the conductive material for forming the shield layer 16 is metal such as copper, titanium, nickel, and gold. At least one of such metals is selected to form a conductive film having a thickness of several micrometers or more as the shield layer 16. The shield layer 16 may be formed by any method such as sputtering, ion plating, CVD, PVD, and plating. Further, the protective member 31 and the holding tape 66 are preferably formed of materials having resistance to the processing in the shield layer forming step. That is, the materials of the protective member 31 and the holding tape 66 are preferably selected from materials having resistance such as vacuum resistance, heat resistance, and chemical resistance according to the types of the processing in the shield layer forming step.

As depicted in FIG. 8C, the protective member peeling step is performed after performing the shield layer forming step. In the protective member peeling step, the protective member 31 is peeled from the back side of each semiconductor package 10 where the bumps 14 are provided. More specifically, the resin layer 13 of each semiconductor package 10 is held on a holding jig (not depicted). In this condition, one end of the holding tape 66 is picked up and horizontally moved. As a result, the protective member 31 is peeled from each semiconductor package 10 in a condition where the protective member 31 is united with the holding tape 66. In this manner, each semiconductor package 10 having an outer surface covered with the shield layer 16 can be manufactured.

Figure 9:
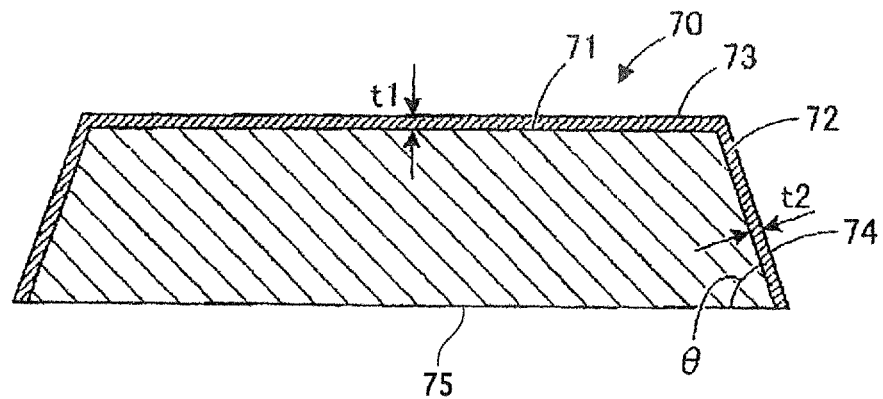
FIG. 9 is a sectional view depicting a thickness of a shield layer formed on a sample.
Figure 10:
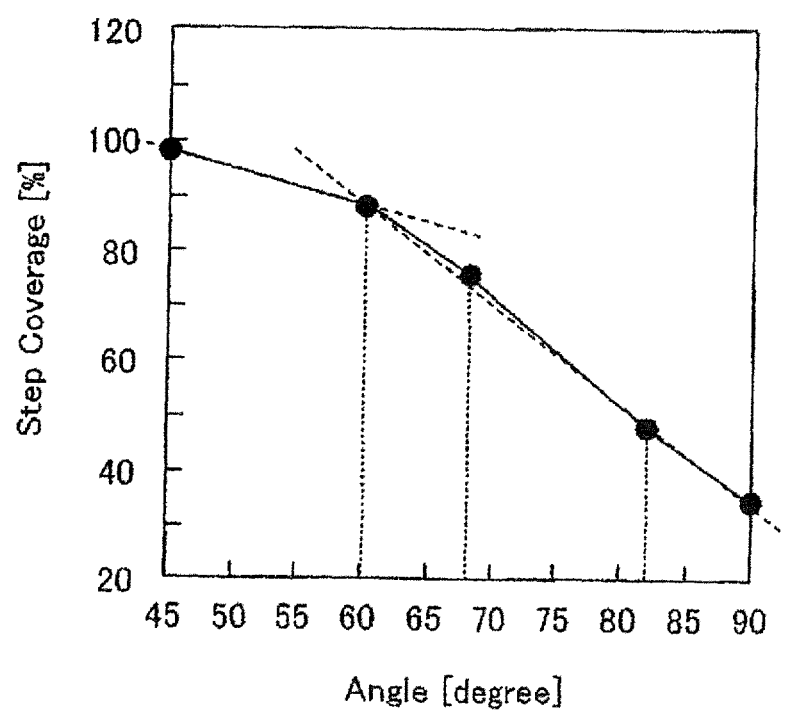
FIG. 10 is a graph depicting the relation between an angle of inclination of a side surface of the sample and a thickness of the shield layer.

There will now be described the relation between the angle of inclination of the inclined surface 25 of each semiconductor package 10 and the thickness of the shield layer 16. FIG. 9 is a sectional view depicting the thickness of a shield layer formed on a sample. FIG. 10 is a graph depicting the relation between the angle θ of inclination of the side surface of the sample and the thickness of the shield layer.

As depicted in FIG. 9, reference numeral 70 denotes a sample having an upper surface 71 and a side surface 72. The sample 70 further has a bottom surface 75 parallel to the upper surface 71. Further, an upper shield layer 73 is formed on the upper surface 71, and a side shield layer 74 is formed on the side surface 72. The side surface 72 is inclined by an angle θ with respect to a vertical direction. The angle θ is defined between the side surface 72 and the bottom surface 75. The present inventor performed a test to examine the relation between the angle θ of inclination of the side surface 72 of the sample 70 and the thickness of each shield layer. In this test, a plurality of samples 70 having different inclination angles 8 were prepared to form a shield layer by performing an ion plating method at a temperature of 180° C. under a pressure of $8 \times 10^{-4}$ Pa. The angle θ of inclination of the side surface 72 was changed to 90, 82, 68, 60, and 45 degrees. Further, the upper shield layer 73 formed on the upper surface 71 and the side shield layer 74 formed on the side surface 72 were observed by using a scanning electron microscope, and the thickness t1 of the upper shield layer 73 and the thickness t2 of the side shield layer 74 were measured according to the images obtained by the scanning electron microscope. The thicknesses t1 and t2 of the upper and side shield layers 73 and 74 were used to calculate a step coverage defined below in Eq. (1). FIG. 10 depicts the relation between the step coverage and the inclination angle θ.

$$\text{Step coverage} = (t2/t1) \times 100 \qquad (1)$$

As apparent from FIG. 10, the step coverage gradually increases with a decrease in the inclination angle θ from 90 degrees, and when the inclination angle θ becomes 45 degrees, the step coverage becomes 100%. More specifically, when the inclination angle θ was set to 45 degrees, the thickness t1 of the upper shield layer 73 was equal to the thickness t2 of the side shield layer 74. That is, it was confirmed that, when the inclination angle θ is 45 degrees, the thickness of the shield layer formed on the upper surface 71 and the side surface 72 of the sample 70 is uniform. Further, the present inventor found that when the step coverage becomes less than 50%, much time is required to form the side shield layer 74, resulting in an increase in process cost. Accordingly, the step coverage is preferably set to 50% or more. That is, the inclination angle θ of the inclined surface 25 of each semiconductor package 10 is preferably set to 45 to 82 degrees.

According to the first to third preferred embodiments mentioned above, the package substrate 15 is held by a holding jig or a holding tape in a condition where the plural bumps 14 are covered with the protective member 31. In this condition, the bumps 14 are embedded in the adhesive layer 32 of the protective member 31, so that the package substrate 15 and the protective member 31 are united with each other. Thus, the package substrate 15 is held through the protective member 31 on the holding jig or the holding tape, so that there is no possibility that the bumps 14 may be damaged. That is, the bumps 14 can be properly protected by the protective member 31.

Figure 11A:
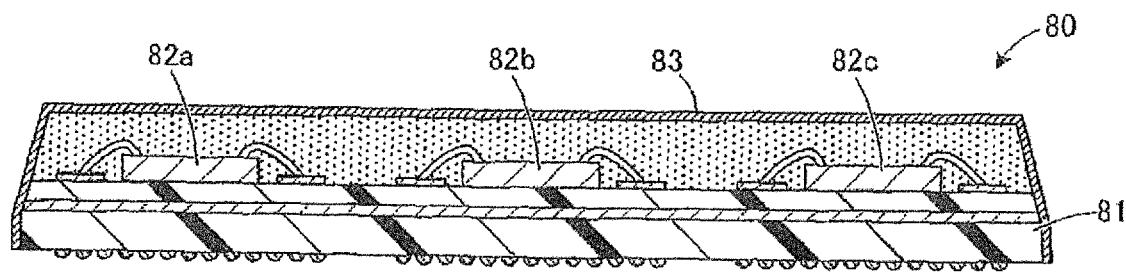
FIGS. 11A and 11B are sectional views depicting modifications of the semiconductor package to be obtained by the present invention.

While each semiconductor package 10 includes the single semiconductor chip 12 mounted on the wiring substrate 11 in the above preferred embodiments, a plurality of semiconductor chips may be mounted on a wiring substrate in each semiconductor package. For example, FIG. 11A depicts a configuration such that a plurality of (e.g., three) semiconductor chips 82a, 82b, and 82c are mounted on a wiring substrate 81 and these semiconductor chips 82a, 82b, and 82c are collectively sealed with resin to manufacture a semiconductor package 80. Further, a shield layer 83 is formed on the outer surface of the semiconductor package 80. In this case, V grooves are formed on a package substrate on a package-by-package basis, and the package substrate is next divided along each V groove on a package-by-package basis. These semiconductor chips 82a, 82b, and 82c may have the same function or may have different functions.

Figure 11B:
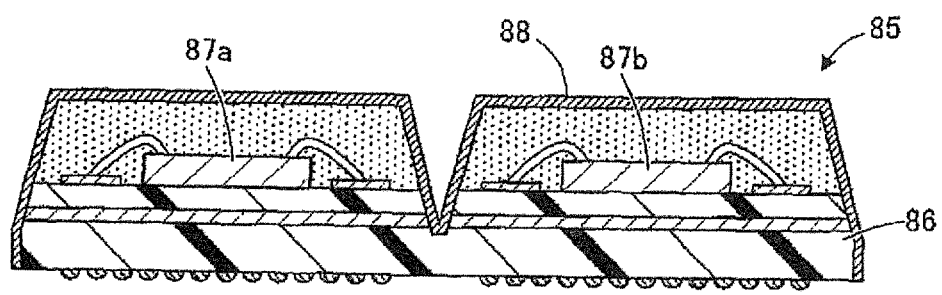

FIG. 11B depicts another configuration such that a plurality of (e.g., two) semiconductor chips 87a and 87b are mounted on a wiring substrate 86 and these semiconductor chips 87a and 87b are separately sealed with resin to manufacture a semiconductor package 85. Further, a shield layer 88 is formed on the outer surface of the semiconductor package 85. In this case, V grooves are formed on a package substrate on a chip-by-chip basis, and the package substrate is next divided along some of these V grooves on a package-by-package basis. The semiconductor chips 87a and 87b may have the same function or may have different functions.

Figure 12A:
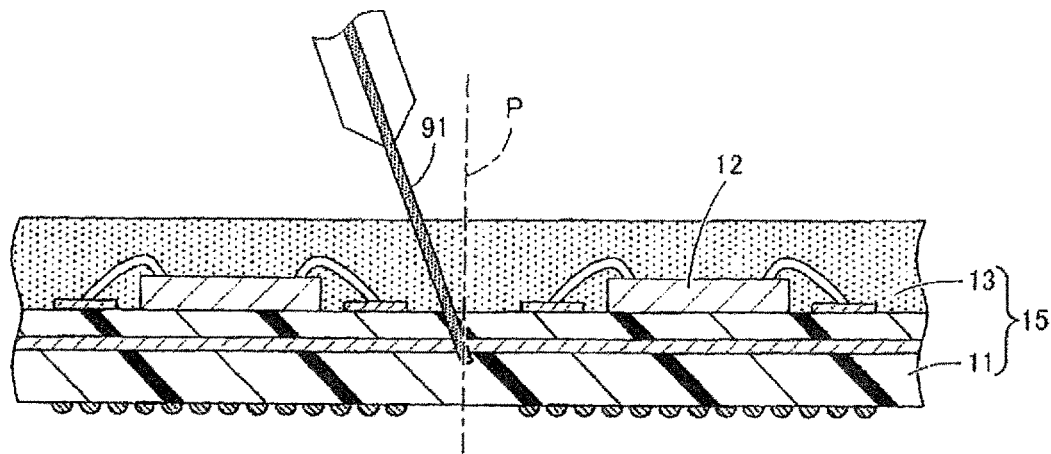
FIGS. 12A, 12B, and 12C are sectional views depicting modifications of the V groove forming step.

While the V blade 46 is used as a V groove forming unit (V groove forming means) in the V groove forming step in the above preferred embodiments, the configuration of the V groove forming unit is not limited. For example, FIG. 12A depicts a configuration such that a usual straight blade 91 is used as the V groove forming unit to form a V groove in the package substrate 15. More specifically, the straight blade 91 is inclined by a predetermined angle to one side with respect to a vertical plane P along each division line set on the package substrate 15. In this condition, the package substrate 15 is cut by the straight blade 91 inclined to one side. Thereafter, the straight blade 91 is inclined by the above predetermined angle to the other side with respect to the vertical plane P. In this condition, the package substrate 15 is cut by the straight blade 91 inclined to the other side. Accordingly, the upper surface of the package substrate 15 is cut away by the straight blade 91 to form a V groove along each division line.

Figure 12B:
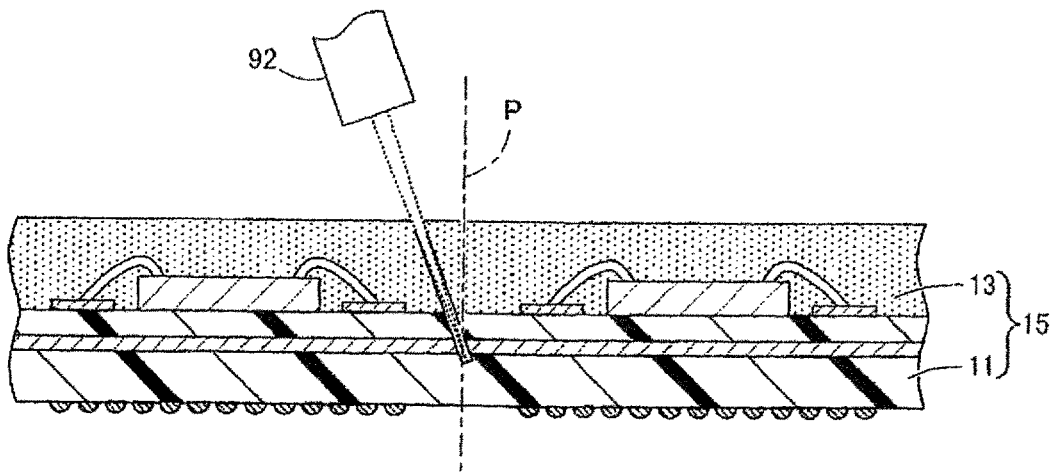

FIG. 12B depicts another configuration such that a processing head 92 for laser ablation is used as the V groove forming unit to form a V groove in the package substrate 15. More specifically, the processing head 92 is inclined by a predetermined angle to one side with respect to a vertical plane P along each division line set on the package substrate 15. In this condition, the package substrate 15 is cut by a laser beam applied from the processing head 92 inclined to one side. Thereafter, the processing head 92 is inclined by the above predetermined angle to the other side with respect to the vertical plane P. In this condition, the package substrate 15 is cut by the laser beam applied from the processing head 92 inclined to the other side. The laser beam has an absorption wavelength to the package substrate 15 to thereby effect the laser ablation to the package substrate 15.

Accordingly, the upper surface of the package substrate 15 is cut away by the laser beam to form a V groove along each division line.

Figure 12C:
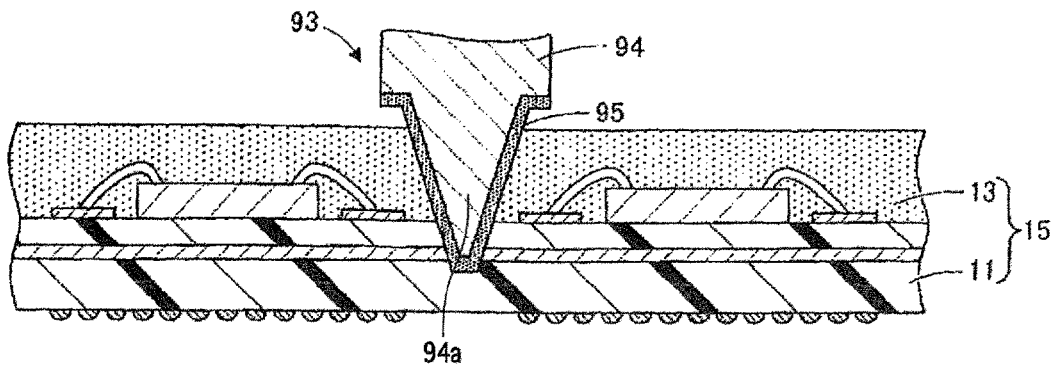

FIG. 12C depicts another configuration such that a profiler 93 is used as the V groove forming unit to form a V groove in the package substrate 15. The profiler 93 is composed of an aluminum base 94 having a substantially V-shaped projection 94a and an abrasive layer 95 formed on the outer surface of the projection 94a by electrodeposition, in which the abrasive layer 95 contains diamond abrasive grains. The profiler 93 is more resistant to wearing than the V blade 46, so that the V shape of the projection 94a of the profiler 93 can be maintained for a long period of time.

Figure 13A:
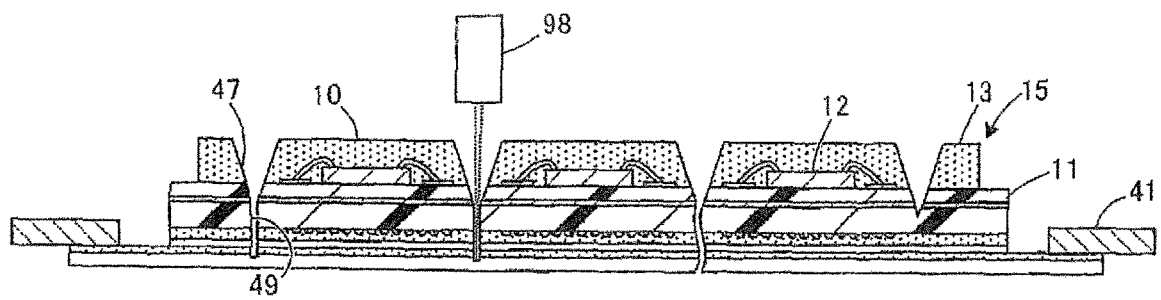
FIGS. 13A and 13B are sectional views depicting modifications of the dividing step.
Figure 13B:
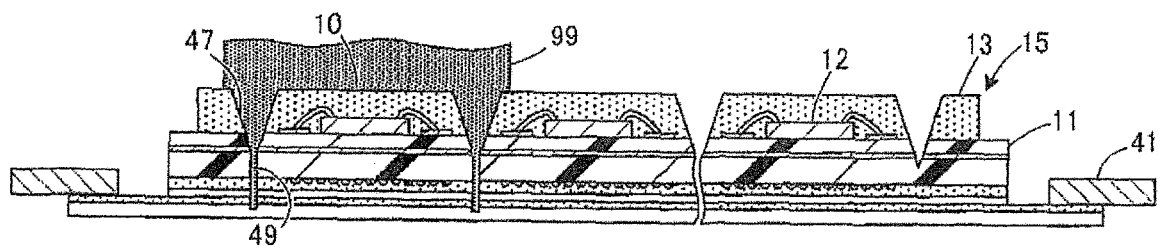

While the straight blade 48 is used as a dividing unit (dividing means) in the dividing step in the above preferred embodiments, the configuration of the dividing unit is not limited. For example, FIG. 13A depicts a configuration such that a processing head 98 for laser ablation is used as the dividing unit to divide the package substrate 15. Further, FIG. 13B depicts another configuration such that a profile grinding tool 99 having a pair of cutting projections 99a is used as the dividing unit to form a V groove in the package substrate 15 and divide the package substrate 15 at the same time. As a modification, a multi-blade may be used in place of the profile grinding tool 99. That is, with the configuration depicted in FIG. 13B, the V groove forming step and the dividing step can be performed at the same time.

Figure 14:
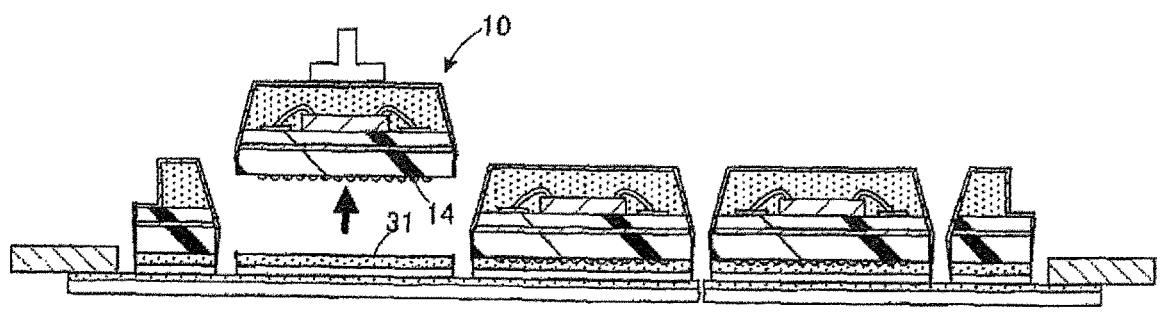
FIG. 14 is a sectional view depicting a modification of the protective member peeling step.

While the protective member 31 is peeled from each semiconductor package 10 by moving the holding tape 52 or 66 in the protective member peeling step in the above preferred embodiments, the configuration of the protective member peeling step is not limited. For example, FIG. 14 depicts a configuration such that each semiconductor package 10 is picked up from the protective member 31 in the protective member peeling step, so that the protective member 31 is peeled from the bumps 14 of each semiconductor package 10.

Figure 15A:
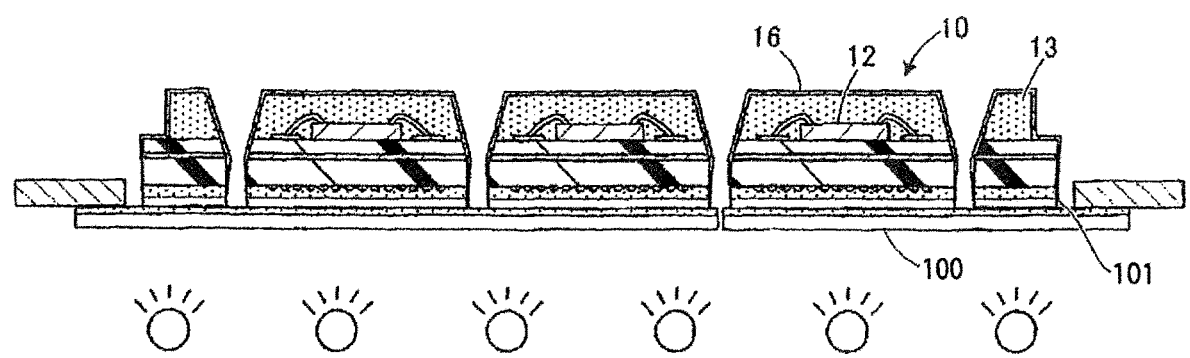
FIGS. 15A and 15B are sectional views depicting another modification of the protective member peeling step.
Figure 15B:
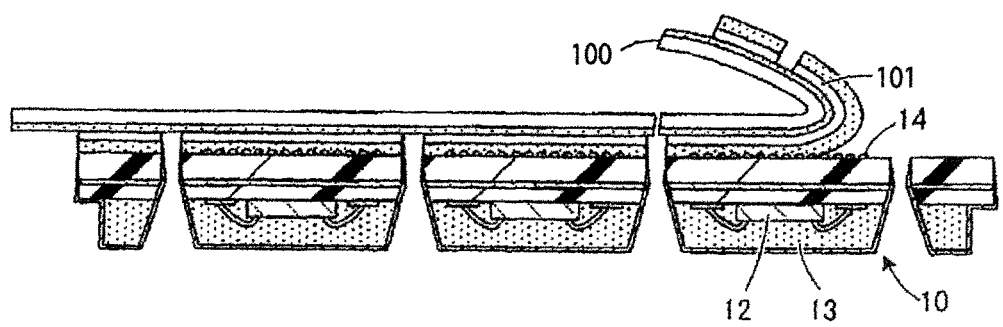

Further, the adhesive layer of the holding tape 52 or 66 may be formed of ultraviolet uncurable adhesive and the adhesive layer of the protective member 31 may be formed of ultraviolet curable adhesive. FIGS. 15A and 15B depict such a modification. In this modification, a holding tape 100 is used to hold each semiconductor package 10 through a protective member 101 as depicted in FIG. 15A, in which the holding tape 100 has an adhesive layer formed of ultraviolet uncurable adhesive, and the protective member 101 has an adhesive layer formed of ultraviolet curable adhesive. In the protective member peeling step, ultraviolet light is applied through the holding tape 100 to the protective member 101 as depicted in FIG. 15A, thereby curing only the adhesive layer of the protective member 101 to reduce the adhesion thereof. Accordingly, the protective member 101 can be peeled from each semiconductor package 10 by moving the holding tape 100 as depicted in FIG. 15B.

While the package substrate 15 is held by the holding tape 42 or 66 or the holding jig 61 in the condition where the protective member 31 is in contact with the holding tape 42 or 66 or the holding jig 61 in the substrate holding step in the above preferred embodiments, the configuration of the substrate holding step is not limited. As a modification, the package substrate 15 may be held by a holding tape or a holding jig in the condition where the resin layer 13 is in contact with the holding tape or the holding jig. This modification will be described in more detail with reference to FIGS. 16A to 16C, in which the steps similar to those mentioned in the first to third preferred embodiments will be omitted herein.

Figure 16A:
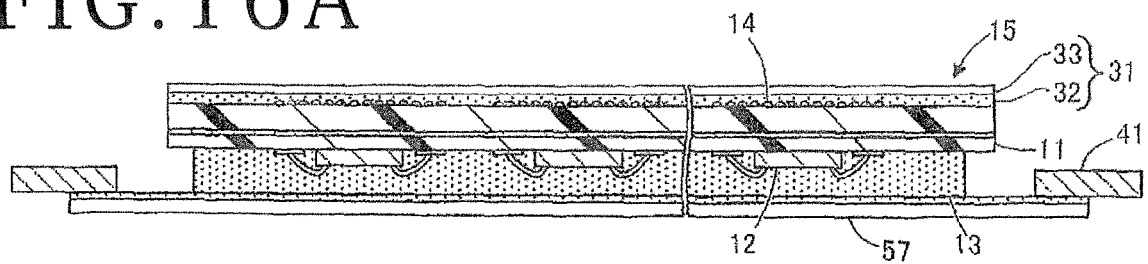
FIGS. 16A, 16B, and 16C are sectional views depicting a package substrate processing method according to a modification of the first preferred embodiment.
Figure 16B:
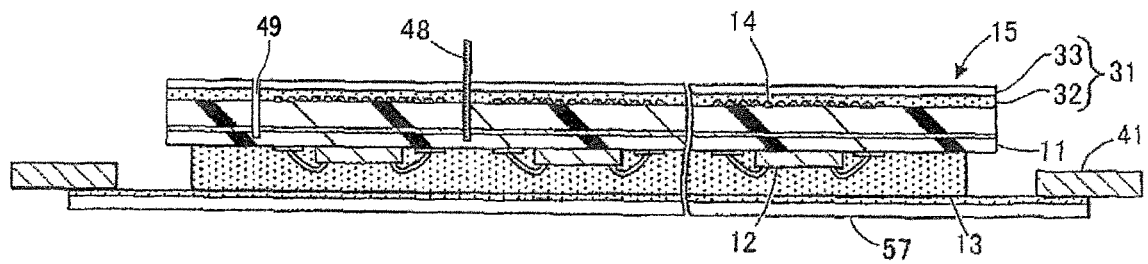

As depicted in FIG. 16A, a substrate holding step is performed in such a manner that the resin layer 13 of the package substrate 15 is held by a holding tape 57. That is, the front side of the package substrate 15 opposite to the protective member 31 is held by the holding tape 57. As depicted in FIG. 16B, a straight groove forming step is performed after performing the substrate holding step. In the straight groove forming step, a straight blade 48 is aligned with each division line of the package substrate 15, and next lowered at a position horizontally outside the package substrate 15 to the depth corresponding to the middle of the thickness of the package substrate 15. Thereafter, the package substrate 15 is moved in a horizontal direction perpendicular to the sheet plane of FIG. 16B as rotating the straight blade 48 about its rotation axis extending in a horizontal direction parallel to the sheet plane of FIG. 16B. Accordingly, the package substrate 15 is half cut along each division line to the depth from the upper surface of the protective member 31 as viewed in FIG. 16B to the middle of the thickness of the wiring substrate 11 by the straight blade 48, thereby forming a straight groove 49 along each division line as depicted in FIG. 16B.

Figure 16C:
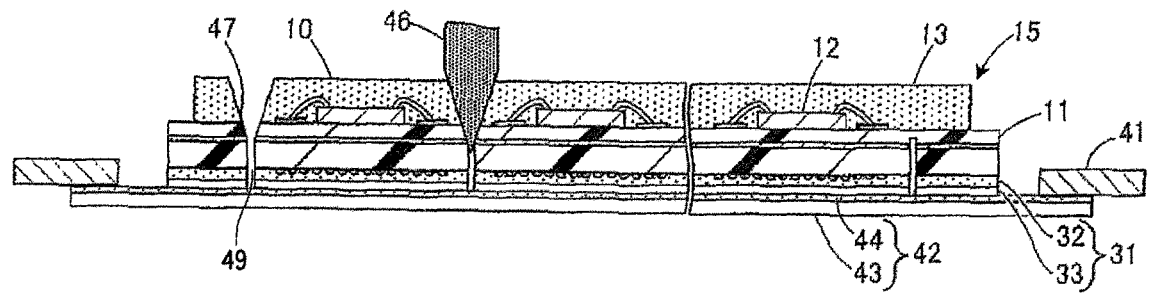

As depicted in FIG. 16C, a substrate holding step is performed again after performing the straight groove forming step. In this substrate holding step, the protective member 31 of the package substrate 15 is held by a holding tape 42. More specifically, the holding tape 57 depicted in FIG. 16B is peeled from the resin layer 13 of the package substrate 15, and the package substrate 15 is next inverted. Thereafter, the holding tape 42 is attached to the protective member 31 of the package substrate 15 as depicted in FIG. 16C. Thereafter, a V groove forming step is performed in such a manner that a V blade 46 is used to cut the package substrate 15 along each straight groove 49 (along each division line), thereby forming a V groove 47 along each division line, the V groove 47 having a depth from the upper surface of the resin layer 13 to the upper end of each straight groove 49 as viewed in FIG. 16C. Accordingly, the package substrate 15 is divided into individual semiconductor packages 10 in this V groove forming step. In this manner, the V groove forming step and the dividing step are performed at the same time in this modification. Thereafter, a shield layer forming step is performed to form a shield layer to the outer surface of each semiconductor package 10 by depositing a conductive material.

While each semiconductor chip is connected through the wires to the terminals of the wiring substrate by wire bonding to manufacture each semiconductor package in the above preferred embodiments, this configuration is merely illustrative. For example, each semiconductor chip may be directly connected to the terminals of the wiring substrate by flip chip bonding to manufacture each semiconductor package.

While the bumps are provided as terminals on the package substrate in the above preferred embodiments, this configuration is merely illustrative. That is, the terminals of the package substrate are not particularly limited. For example, lands may be provided on the terminals of the package substrate.

In the above preferred embodiments, the holding jig may be any jig capable of holding the package substrate, such as a substrate.

Further, each semiconductor chip in the above preferred embodiments may be any chip type component adapted to be mounted on the wiring substrate.

Further, the V groove forming step and the dividing step may be performed by using the same apparatus or different apparatuses in the above preferred embodiments.

While the processing method according to the above preferred embodiments is applied to the processing for the package substrate, the processing method may be applied to the processing for any plate-shaped workpiece, in which the workpiece is intended to be divided. Accordingly, the processing method according to the present invention is not limited to the configuration including the formation of V grooves and a shield layer.

Further, the plate-shaped workpiece is not limited to the package substrate as described in the above preferred embodiments, but any workpiece having terminals may be used. For example, various substrates such as a semiconductor substrate, inorganic material substrate, and package substrate may be used. The semiconductor substrate may be formed of silicon, gallium arsenide, gallium nitride, or silicon carbide, for example. Examples of the package substrate include various substrates for chip size package (CSP), wafer level chip size package (WLCSP), system in package (SIP), and fan out wafer level package (FOWLP). In the case of FOWLP substrate, chips may be mounted on a redistribution layer. Accordingly, the wiring member usable in the present invention includes not only a wiring substrate such as PCB substrate, but also a redistribution layer in a FOWLP substrate.

Further, each semiconductor package is applicable not only to mobile communication equipment such as a mobile phone, but also to any other electronic equipment such as a camera.

Further, the above preferred embodiments and various modifications may be combined generally or partially to perform other preferred embodiments.

The present invention is not limited to the above preferred embodiments and modifications mentioned above, but various modifications, replacements, and changes may be made within the scope of the present invention. Further, if the technical idea of the present invention can be realized by any other methods using any technical progress or derivative techniques, the present invention may be embodied by using these methods. Accordingly, the present invention claimed herein is intended to cover all embodiments that may fall within the scope of the present invention.

Further, while the present invention is applied to a processing method for a package substrate in the above description, the present invention is also applicable to a processing method for any other workpieces having terminals.

As described above, the present invention has an effect such that a plate-shaped workpiece can be properly processed without causing terminal defects. In particular, the present invention is useful for a processing method for a package substrate to be divided into individual semiconductor packages for use in mobile communication equipment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A plate-shaped workpiece processing method for dividing a plate-shaped workpiece into a plurality of individual packages along a plurality of crossing division lines, the workpiece including a wiring member having a first surface and a second surface opposite to the first surface, the first surface of the wiring member being partitioned into a plurality of regions by the plurality of crossing division lines, a plurality of terminals formed on each region of the first surface of the wiring member, a plurality of semiconductor chips mounted on the second surface of the wiring member by bonding, and a sealing layer formed on the second surface of the wiring member so as to seal the plurality of semiconductor chips, the sealing layer being formed from a sealing compound, the plate-shaped workpiece processing method comprising:
 a protective member attaching step of attaching a protective member to the first surface of the wiring member, the protective member having an adhesive layer for protecting the plurality of terminals and a base sheet attached to the adhesive layer;
 a dividing step of dividing the plate-shaped workpiece and the protective member along each division line of the plurality of crossing division lines after performing the protective member attaching step, thereby obtaining the individual packages in a condition where the protective member is attached to each package of the plurality of individual packages, wherein the dividing step includes cutting through both the base sheet and the adhesive layer of the protective member;
 a shield layer forming step of forming a conductive shield layer on an outer surface of each package of the plurality of individual packages after performing the dividing step; and
 a protective member peeling step of peeling the protective member from each package of the plurality of individual packages after performing the shield layer forming step.

2. A plate-shaped workpiece processing method for dividing a plate-shaped workpiece into a plurality of individual packages along a plurality of crossing division lines, the workpiece including a wiring member having a first surface and a second surface opposite to the first surface, the first surface of the wiring member being partitioned into a plurality of regions by the plurality of crossing division lines, a plurality of terminals formed on each region of the first surface of the wiring member, a plurality of semiconductor chips mounted on the second surface of the wiring member by bonding, and a sealing layer formed on the second surface of the wiring member so as to seal the plurality of semiconductor chips, the sealing layer being formed from a sealing compound, the plate-shaped workpiece processing method comprising:
 a protective member attaching step of attaching a protective member to the first surface of the wiring member, the protective member having an adhesive layer for protecting the plurality of terminals;
 a dividing step of dividing the plate-shaped workpiece and the protective member along each division line of the plurality of crossing division lines after performing the protective member attaching step, thereby obtaining the individual packages in a condition where the protective member is attached to each package of the plurality of individual packages;
 a shield layer forming step of forming a conductive shield layer on an outer surface of each package of the plurality of individual packages after performing the dividing step;
 a protective member peeling step of peeling the protective member from each package of the plurality of individual packages after performing the shield layer forming step; and
 a workpiece holding step of holding the workpiece through the protective member on a holding jig after performing the protective member attaching step,
 wherein the protective member is held under suction on the holding jig.

3. The plate-shaped workpiece processing method according to claim 2, further comprising:
 a V groove forming step of cutting the workpiece along each division line of the plurality of crossing division lines to the depth from an upper surface of the sealing layer to a middle of a thickness of the plate-shaped workpiece by using a V groove forming unit after performing the workpiece holding step, thereby forming a V groove in the plate-shaped workpiece along each division line of the plurality of crossing division lines, the V groove having a side wall inclined from the upper surface of the sealing layer to a bottom of the V groove.

4. The plate-shaped workpiece processing method according to claim 1, further comprising:

a workpiece holding step of holding the plate-shaped workpiece through the protective member on a holding tape after performing the protective member attaching step, wherein the protective member is attached to the holding tape.

5. The plate-shaped workpiece processing method according to claim 4, further comprising:

a V groove forming step of cutting the plate-shaped workpiece along each division line of the plurality of crossing division lines to the depth from the upper surface of the sealing layer to the middle of the thickness of the plate-shaped workpiece by using a V groove forming unit after performing the workpiece holding step, thereby forming a V groove in the plate-shaped workpiece along each division line of the plurality of crossing division lines, the V groove having a side wall inclined from the upper surface of the sealing layer to the bottom of the V groove.

\* \* \* \* \*